United States Patent
Schwartz et al.

(10) Patent No.: US 8,093,115 B2
(45) Date of Patent: Jan. 10, 2012

(54) TUNING OF SOI SUBSTRATE DOPING

(75) Inventors: Wolfgang Schwartz, Au (DE); Alfred Haeusler, Freising (DE); Vladimir Frank Drobny, Tucson, AZ (US)

(73) Assignee: Texas Instruments Deutschland GmbH, Freising (DE)

( * ) Notice: Subject to any disclaimer, the term of this patent is extended or adjusted under 35 U.S.C. 154(b) by 0 days.

(21) Appl. No.: 12/886,727

(22) Filed: Sep. 21, 2010

(65) Prior Publication Data

US 2011/0070719 A1    Mar. 24, 2011

(30) Foreign Application Priority Data

Sep. 22, 2009 (DE) .................... 10 2009 042 514

(51) Int. Cl.
 *H01L 21/338* (2006.01)
 *H01L 21/425* (2006.01)
(52) U.S. Cl. ... 438/179; 438/479; 438/517; 257/E21.32; 257/E21.561; 257/E27.112

(58) Field of Classification Search .................. 438/149, 438/479, 517; 257/347, E21.32, E27.112, 257/E21.561
See application file for complete search history.

(56) References Cited

U.S. PATENT DOCUMENTS

| 7,075,155 B1 * | 7/2006 | Pelella ......................... 257/355 |
| 2009/0072290 A1 | 3/2009 | Cheng et al. | |
| 2009/0230447 A1 * | 9/2009 | Hwang ......................... 257/296 |

* cited by examiner

*Primary Examiner* — Hsien Ming Lee
(74) *Attorney, Agent, or Firm* — Warren L. Frantz; Wade J. Brady III; Frederick J. Telecky, Jr

(57) ABSTRACT

A method of manufacturing a semiconductor device, the method comprising: taking an SOI substrate comprising a bulk substrate, a buried insulating layer and an active layer, and implanting the bulk substrate from the side of and through the insulating layer and the active layer so as to generate an area having an increased doping concentration in the bulk substrate at the interface between the bulk substrate and the insulating layer.

6 Claims, 2 Drawing Sheets

TUNING OF SOI SUBSTRATE DOPING

FIELD OF THE INVENTION

The invention relates to silicon on insulator substrate doping and an integrated semiconductor device.

BACKGROUND

Silicon on insulator (SOI) substrates usually include a bulk substrate (also referred to as handle wafer substrate), a buried oxide dielectric (also referred to as insulating layer, BOX) and an active layer (also referred to as top silicon). SOI wafers need to be specified in a way such that unwanted non-equilibrium conditions are prevented at the interface between the bulk substrate and the buried oxide dielectric. These unwanted non-equilibrium conditions can be triggered by sudden bias changes of structures in the top silicon. A non-equilibrium condition can be a deep depletion state and an incomplete inversion. The deep depletion state can be recovered by thermal generation of minority carriers. However, this can take seconds to several minutes, during which the displacement currents of the recovering regions disturb high precision, low current leakage electrical circuits (for example high impedance JFET input stages or switched capacitor circuits). Deep depletion states can occur if the doping polarity of the handle wafer is of the same type as the bias potential of the top silicon (positive voltage surge over p-type handle wafer or negative voltage surge over n-type handle wafer). In order to prevent non-equilibrium states, an appropriate polarity of the handle wafer material may be chosen or the doping concentration of the handle wafer may be increased. However, there are cases in which the polarity of the handle wafer cannot be chosen arbitrarily as the bias voltage level may be negative and/or positive with respect to the handle wafer. In this case, the handle wafer doping needs to be increased sufficiently in order to prevent inversion and the associated deep depletion effect. Although increasing the doping of the handle wafer may be possible for low voltage technologies, an increased handle wafer doping may conflict with the requirement of low doping concentrations of active high voltage components (bipolar collectors, JFET gates) for high voltage technologies. For high voltage technologies the increased doping concentration of the handle wafer can cause auto-doping of the lower doped active silicon regions which can adversely affect the functionality of the circuit.

SUMMARY

It is an object of the invention to provide a method and a semiconductor device which do not suffer from the adverse effects of non-equilibrium conditions.

In a first aspect of the invention a method of manufacturing a semiconductor device is provided. Accordingly, a SOI substrate is used, which comprises a bulk substrate, a buried insulating layer and an active layer. The bulk substrate is implanted through the insulating layer and the active layer so as to generate an area having an increased doping concentration in the bulk substrate at the interface between the bulk substrate and the insulating layer. This provides that an area with an increased doping concentration is formed close or even adjacent to the buried oxide layer in the bulk substrate. Since this portion of the bulk substrate usually suffers from deep depletion, this is an efficient countermeasure against the non-equilibrium condition. Since the implant is performed through the active layer and the insulating layer, the profile of the doped region can be well controlled. Surprisingly, although the step of implanting is performed through the active layer, the properties of the active layer are not adversely affected as with a heavily doped handle wafer.

According to an aspect of the invention, a buried layer can be implemented in the active layer before the step of implanting the bulk substrate. This provides that diffusion of doping atoms during annealing steps relating to the buried layer is avoided. However, even with a buried layer, it is advantageous to implant the bulk layer through the active layer and insulating layer in accordance with the invention.

In an embodiment, a screen oxide may be applied (deposited) before the step of implanting the bulk substrate and after the step of implementing the buried layer. This prevents contamination of the active layer during the step of implanting the bulk substrate. The depth of the screen oxide may only be about 20 nm.

The step of implanting can be performed with an energy of 1 MeV more (high energy implant). An energy of about 1 MeV may be used for boron and an energy of about 1.5 MeV may be used for phosphorous. The step of implanting may use a dosage of atoms of $10^{14}/cm^2$ to $5\times10^{14}/cm^2$.

In one aspect of the invention, the implant is performed so as to provide a layer entirely covering the surface of the bulk substrate adjacent to the buried oxide layer as a blanket. In another aspect of the invention, a mask is provided on top of the active silicon layer in order to form a specific pattern of implant areas in the surface of the bulk substrate adjacent to the buried oxide layer.

The invention also provides an integrated semiconductor device with a SOI substrate. The substrate comprises a bulk substrate, a buried oxide layer on top of the bulk substrate and an active silicon layer carried by the buried oxide. Furthermore there is an area having an increased doping concentration in the bulk substrate at the interface between the bulk substrate and the insulating layer. A semiconductor device manufactured according to this aspect to the invention is less sensitive to auto-doping and avoids conflicts with respect to the required low doping concentrations of active high voltage components, as, for example bipolar collectors or JFET gates. The doping concentration of the bulk substrate of the handle wafer remains substantially unchanged on the surface opposite to the insulating layer. The undesired side effects of auto-doping from the backside of the handle wafer are avoided. Furthermore, the polarity of the handle wafer part near its interface with the buried insulating layer may selectively be changed.

The depth of the implant (depth of the region with increased doping concentration measured from the interface between bulk substrate and insulating layer) may be between 1 μm and 2 μm, and in particular 1.8 μm. This provides that only a limited region of the bulk substrate has an increased doping concentration.

The integrated semiconductor may advantageously be configured for supply voltage levels of at least 20 V up to several hundreds of Volts. The aspects of the invention advantageously apply to high voltage applications. The depth of the active layer may be about 1 μm. The active layer may have rather low doping concentrations of about $10^{14}/cm^3$ to $10^{15}/cm^3$ and the implanted area in the bulk substrate on the interface between insulating layer and bulk substrate may have doping concentrations of about $10^{18}/cm^3$ to $10^{19}/cm^3$. The doping concentration of the bulk substrate on the surface opposite to the insulating layer may also be low, for example between $10^{14}/cm^3$ and $10^{15}/cm^3$. This prevents auto-doping (also referred to as cross-contamination of the active layer).

BRIEF DESCRIPTION OF DRAWINGS

Further aspects of the invention will be apparent from the following description of the example embodiments of the invention described below with reference to the accompanying drawings, wherein.

DETAILED DESCRIPTION OF EXAMPLE EMBODIMENTS

Figure 1:
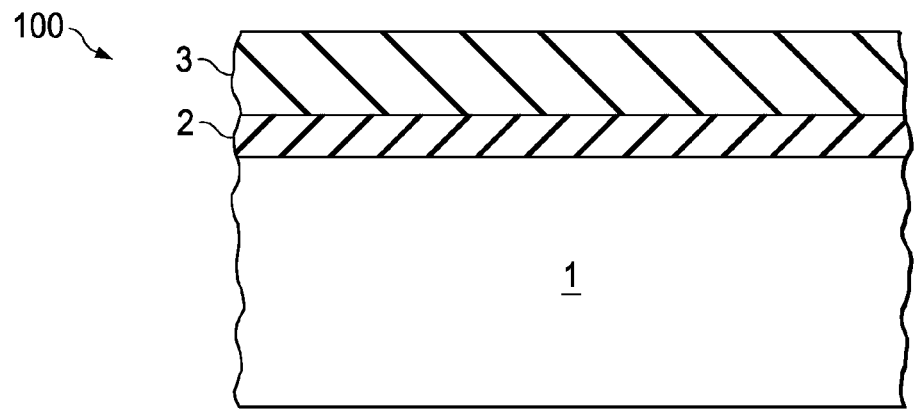
FIG. 1 shows a cross-sectional view of a SOI substrate.

FIG. 1 shows a cross-sectional view of a SOI substrate or SOI wafer that can include a p-type or n-type bulk substrate or handle wafer 1 with low doping concentration of, for example, between $10^{14}/cm^3$ and $10^{15}/cm^3$. The low doped handle wafer or bulk substrate 1 carries a buried insulating layer (BOX dielectric) 2. On top of the insulating layer 2, there is an active silicon layer (SOI) 3.

Figure 2:
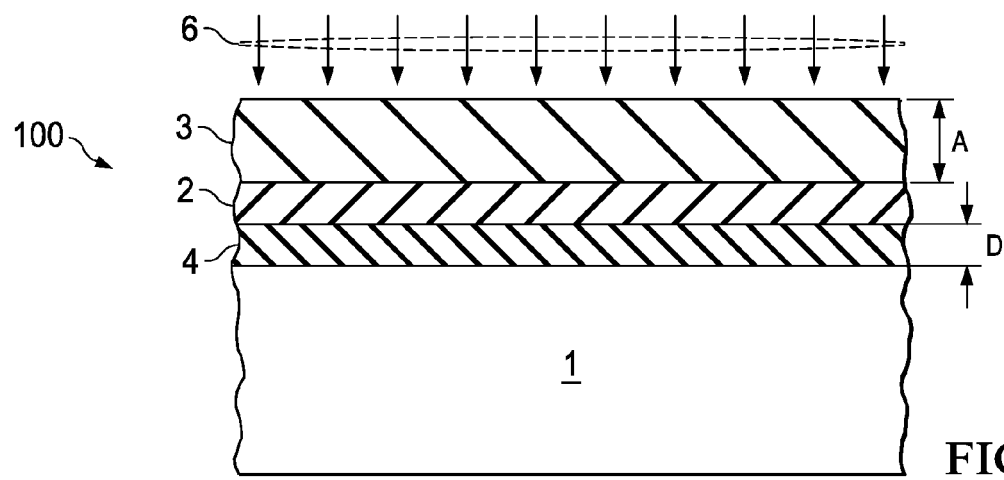
FIG. 2 shows a first embodiment of the invention.

FIG. 2 shows a cross-sectional view of a substrate or wafer which is manufactured according to aspects of the invention. There is the n-type or p-type bulk substrate or handle wafer 1 with low doping concentration, the buried insulating layer (BOX dielectric) 2 and the active silicon (SOI) 3. According to an aspect of the invention, an additional high energy implant step 6 is performed in order to generate an increased doping area 4 at the interface between the bulk substrate 1 and the insulating layer 2. This provides an area with an increased doping concentration 4 that covers the handle wafer as a kind of a blanket and prevents this portion of the bulk substrate 1 from turning into deep depletion in response to an active component in the SOI 3 layer. If boron atoms are implanted an energy of about 1 MeV may be used. For phosphorous atoms, an energy of about 1.5 MeV may be used. The dosage for the high energy implant may be between $10^{14}/cm^2$ and $5\times10^{14}/cm^2$. A buried layer (not shown) may be implemented in the active layer before the step of implanting the bulk substrate. This provides that diffusion of doping atoms during annealing steps relating to the buried layer is avoided. However, even with a buried layer, it is possible to implant the bulk layer through the active layer and the insulating layer. Furthermore, a screen oxide (not shown) may be applied (deposited) on top of the SOI 3 layer before the step of implanting the bulk substrate and after the step of implementing the buried layer (not shown). This prevents contamination of the active layer during the step of implanting the bulk substrate. The depth of the screen oxide may only be about 20 nm.

In an embodiment of the invention, an integrated semiconductor device 100 may have the SOI substrate as shown in FIG. 2. The SOI substrate would then comprise a bulk substrate 1, a buried oxide layer 2 on top of the bulk substrate and an active silicon layer 3 carried by the buried oxide. Furthermore, there is an area 4 having an increased doping concentration in the bulk substrate 1 at the interface between the bulk substrate and the insulating layer. The semiconductor device 100 manufactured according to this embodiment is less sensitive to auto-doping and avoids conflicts with respect to the required low doping concentrations of active high voltage components, as, for example, bipolar collectors or JFET gates. The depth D of the implant (depth of the region with increased doping concentration measured from the interface between bulk substrate and insulating layer) may be between 1 µm and 2 µm, and in particular about 1.8 µm. This provides that only a limited region of the bulk substrate 1 has an increased doping concentration. The integrated semiconductor device 100 may be configured for supplying voltage levels of at least 20 V up to several hundreds of Volts (e.g., 200 V, 300 V, etc.). The depth A of the active layer SOI 3 may be about 1 µm. The active layer SOI 3 may have rather low doping concentrations of about $10^{14}/cm^3$ to $10^{15}/cm^3$. The implanted area 4 in the bulk substrate on the interface between insulating layer 2 and bulk substrate 1 may have doping concentrations of about $10^{18}/cm^3$ to $10^{19}/cm^3$. The doping concentration of the bulk substrate 1 on the surface opposite to the insulating layer may also be low, for example between $10^{14}/cm^3$ and $10^{15}/cm^3$. This prevents auto-doping (also referred to as cross-contamination of the active layer) during manufacture of the electronic device 100.

Figure 3:
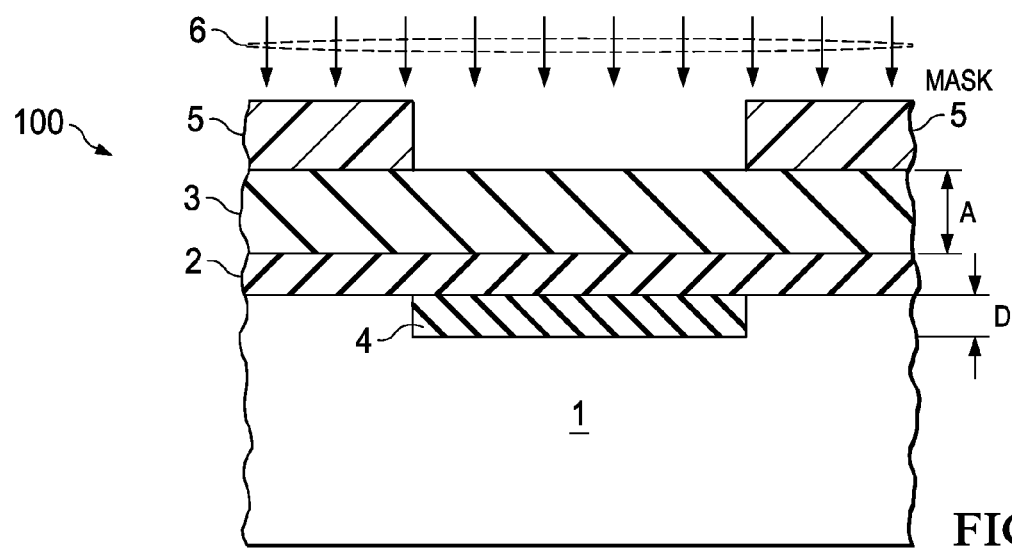
FIG. 3 shows a cross-sectional view of a wafer according to aspects of the invention.

FIG. 3 shows a cross-sectional view of a substrate (also an electronic device 100) according to other aspects of the invention. Instead of creating a complete blanket at the interface between the bulk substrate 1 and the insulating layer 2 as shown in FIG. 2, a more selective approach makes it possible to selectively provide regions of increased doping 4 below specific active components in the SOI 3 layer.

Figure 4:
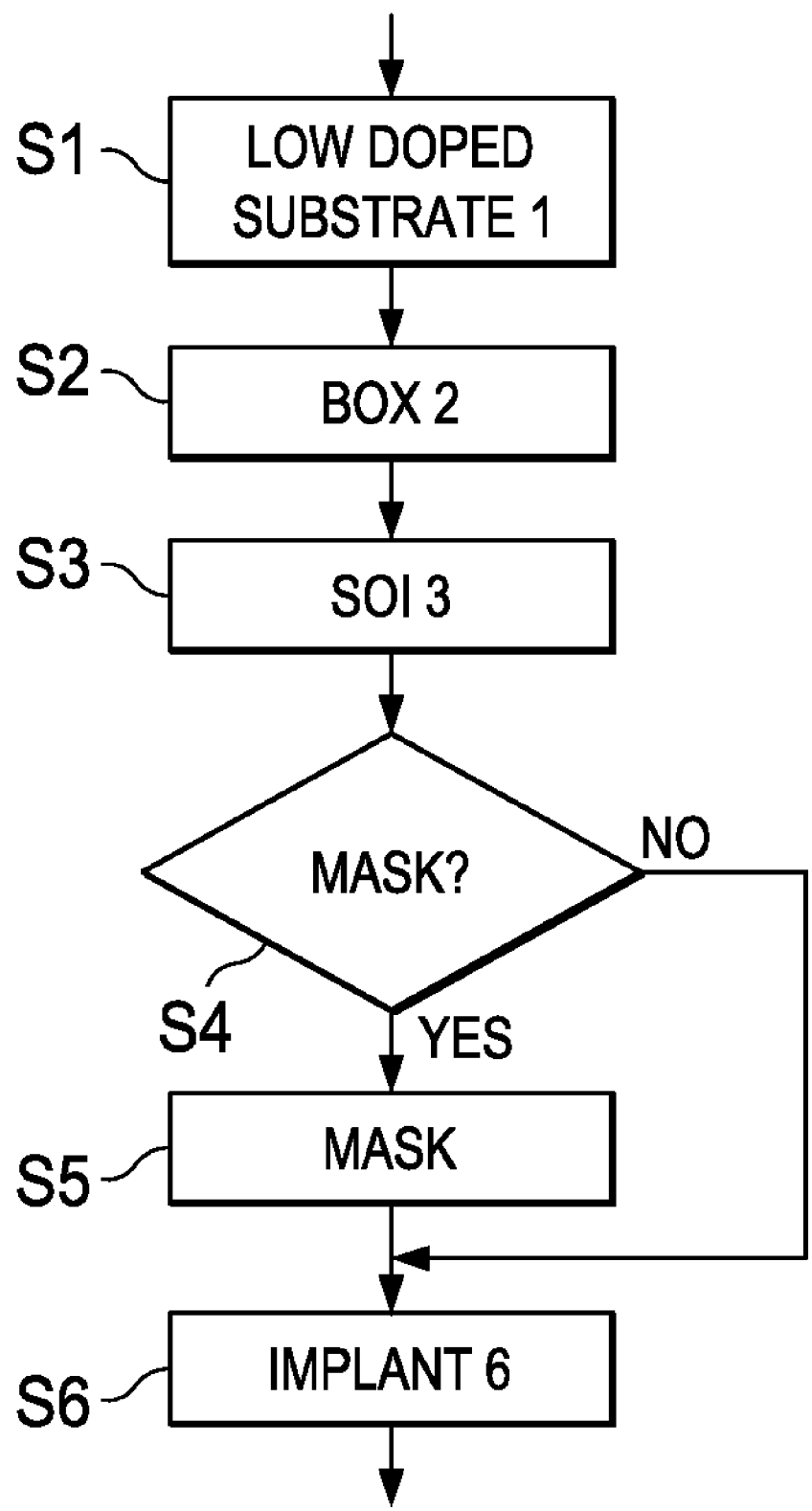
FIG. 4 shows a flow diagram of a method according to aspects of the invention.

FIG. 4 shows a flow diagram of a method according to aspects of the invention. During step S1, a low doped substrate of n-type or p-type is provided. In step S2, a buried insulating layer (buried dielectric or buried oxide) 2 is deposited on the low doped substrate. In step S3, an active silicon layer SOI 3 is grown on the buried insulating layer 2. In step S4, it is decided whether or not an additional mask is provided on top of the SOI 3 layer. If a mask is to be applied, step S5 is performed. If a complete blanket at the interface between the bulk substrate 1 and the insulating layer 2 is to be provided, step S5 is omitted. In step S6, a high energy implant step is performed in order to increase the doping concentration in the increased doping area 4. A high energy implant means that an energy of 1 MeV to 1.5 MeV or above is used. Since a portion of the bulk substrate close to the interface between the insulating layer (BOX 2) and bulk substrate (handle wafer 1) usually suffers from deep depletion, the implanted area is an efficient countermeasure against the non-equilibrium condition. Furthermore, the implant is performed through the active layer 3 and through the insulating layer 2. This means that the profile of the doped region can be well controlled. The depth and profile of the implanted region changes only little as there are only a few subsequent manufacturing steps. A buried layer may be implemented in the active layer 3 before the step of implanting the bulk substrate 1. Implementing a buried layer in the active layer usually requires additional annealing (heating) of the SOI substrate. However, if the step of implanting is performed after forming the buried layer, the diffusion of doping atoms during annealing steps used for forming the buried layer is avoided. Even with a buried layer, it is still possible to implant the bulk substrate 1 through the active layer 3 and insulating layer 2 in accordance with aspects of the invention. A screen oxide may be applied before the step of implanting the bulk substrate 1 and after the step of implementing the buried layer. This can further prevent cross-contamination of the active layer 3 during the step of implanting the bulk substrate 1. The depth of the screen oxide may only be about 20 nm.

Although the invention has been described hereinabove with reference to specific embodiments, it is not limited to these embodiments and no doubt further alternatives will occur to the skilled person that lie within the scope of the invention as claimed.

The invention claimed is:

1. A method of manufacturing a semiconductor device, the method comprising:

taking an SOI substrate comprising a bulk substrate of given conductivity type, a buried insulating layer and an active layer, and blanket implanting the bulk substrate with doping of the given conductivity type from the side of and through the insulating layer and the active layer so as to generate a region having an increased doping concentration of the given conductivity type in the bulk substrate entirely covering a surface of the bulk substrate at the interface between the bulk substrate and the insulating layer.

2. The method according to claim 1, further comprising implementing a buried layer in the active layer before the step of blanket implanting the bulk substrate.

3. The method according to claim 2, further comprising applying a screen oxide before the step of blanket implanting the bulk substrate and after the step of implementing the buried layer.

4. The method according to claim 3, wherein the depth of the screen oxide is about 20 nm.

5. The method according to claim 1, wherein the step of blanket implanting is performed with an energy of 1 MeV or more.

6. The method according to claim 1, wherein the step of blanket implanting uses a dosage between $10^{14}/cm^2$ to $5\times10^{14}/cm^2$.

* * * * *